United States Patent
Kuzmenka (10) Patent No.: US 7,457,589 B2
(45) Date of Patent: Nov. 25, 2008

(54) CIRCUIT AND METHOD FOR TRANSMITTING A SIGNAL

(75) Inventor: Maksim Kuzmenka, Munich (DE)

(73) Assignee: Infineon Technologies AG, Munich (DE)

( * ) Notice: Subject to any disclaimer, the term of this patent is extended or adjusted under 35 U.S.C. 154(b) by 559 days.

(21) Appl. No.: 11/000,323

(22) Filed: Nov. 30, 2004

(65) Prior Publication Data

US 2006/0116086 A1 Jun. 1, 2006

(51) Int. Cl.
*H04B 17/00* (2006.01)

(52) U.S. Cl. .......... 455/67.16; 455/242.1; 455/91; 455/103; 455/265; 365/194

(58) Field of Classification Search ........... 455/67.16, 455/242.1, 91, 103, 265; 365/194
See application file for complete search history.

(56) References Cited

U.S. PATENT DOCUMENTS

| | | | | |
|---|---|---|---|---|
| 5,191,581 A | * | 3/1993 | Woodbury et al. | 370/364 |
| 5,525,914 A | * | 6/1996 | Cao et al. | 326/71 |
| 6,799,153 B1 | * | 9/2004 | Sirichotiyakul et al. | 703/19 |
| 6,834,255 B2 | * | 12/2004 | Abrosimov et al. | 702/181 |
| 6,990,644 B2 | * | 1/2006 | Feng | 716/6 |
| 7,202,725 B2 | * | 4/2007 | Tsutsumi et al. | 327/261 |
| 2002/0008559 A1 | * | 1/2002 | Krishnamurthy et al. | 327/206 |
| 2003/0141915 A1 | | 7/2003 | Tsutsumi et al. | |
| 2004/0032002 A1 | | 2/2004 | Klass et al. | |
| 2005/0237828 A1 | * | 10/2005 | Kennedy et al. | 365/194 |

* cited by examiner

*Primary Examiner*—Sanh D Phu
(74) *Attorney, Agent, or Firm*—Slater & Matsil, L.L.P.

(57) ABSTRACT

A circuit for transmitting a signal has a first signal line and a second signal line, wherein the second signal line is arranged adjacent to the first signal line, such that an interaction between signals being transmitted on the signal lines takes place. The circuit further comprises a first driver for driving a first signal on the first signal line, wherein the first signal comprises a delay. A second driver is configured for driving a second signal on the second signal line depending on the delay of the first signal, such that the delay of the first signal is adjusted due to the interaction of the second signal on the first signal. A method and computer program are also disclosed.

20 Claims, 5 Drawing Sheets

CIRCUIT AND METHOD FOR TRANSMITTING A SIGNAL

BACKGROUND OF THE INVENTION

1. Field of the Invention

The present invention refers to circuits and methods for transmitting a signal, and in particular to circuits and methods which can be used for transmitting a signal within a chip, within a circuit module or a PLL circuit. Basically the present invention refers to adjustable delay circuits being very widely used in a modern chip and system design, like a PLL, DLL (Delay Locked Loop) or OCD (Off Chip Driver).

2. Description of the Related Art

Current semiconductor chips or circuit boards comprise a plurality of high-speed signals. For the proper functionality of a circuit, an accurate arrival time of a signal at a receiver is very important. The arrival time depends for example on the length of a signal path, capacitances or cross-talk between neighboring signal lines.

In modern integrated circuits or system designs very often arises the problem of an accurate aligning of data and strobe signals in order to provide an optimal receiving condition. The optimal receiving condition usually means placing the strobe in the middle of the bit-time of binary data. To achieve the alignment of the strobe signal in the middle of the bit-time of binary data, there is often a time-shift necessary. Normally, the insertion of additional capacitance into a signal path or a layout option which allows passing a signal through traces with different lengths is used for a time shift of a signal. Another possibility for a time shift of a signal is to insert an inverter chain into the signal path. Inverters allow a time delay by steps of approximately 50 ps which is not fine enough for many designs.

The present methods for shifting a signal are often difficult to realize, have a bad influence on the signal quality, are difficult to adjust or do not provide a possibility to adjust a time shift of the signal during the operation of a circuit. Therefore, the arrival time of a signal at a receiver is often not accurate enough to provide a secure transmission of a signal information.

SUMMARY OF THE INVENTION

In one aspect, the present invention provides a circuit and a method for transmitting a signal, which allow a secure transmission of the signal and a possibility to vary a signal propagation delay.

In accordance with a first aspect, the present invention provides a circuit for transmitting a signal, having a first signal line, a second signal line, wherein the second signal line is arranged adjacent to the first signal line, such that an inductive and/or capacitive interaction between signals being transmitted on the signal lines takes place, a first driver for driving a first signal on the first signal line, wherein the first signal comprises a delay, and a second driver for driving a second signal on the second signal line, wherein the second driver is configured to drive the second signal depending on the delay of the first signal, such that the delay of the first signal is adjusted due to the interaction of the second signal on the first signal.

In accordance with a second aspect, the present invention provides a method for transmitting a signal having the steps of driving a first signal on a first signal line, wherein the first signal comprises a delay, driving a second signal on a second signal line, wherein the second signal line is arranged adjacent to the first signal line, such that an interaction between signals being transmitted on the signal lines takes place, wherein the second signal is driven depending on the delay of the first signal, such that the delay of the first signal is adjusted due to the interaction of the second signal or the third signal.

In accordance with a third aspect, the present invention provides a computer program having a program code for performing the method for transmitting a signal when the computer program runs on a computer.

Embodiments of the present invention are based on the finding that it is possible to change a delay of a signal by applying an inverted or not inverted signal with the same data stream to neighboring shielding traces.

The preferred embodiment approach has the advantage that it provides a possibility to change a delay of a signal just by a digital switching of adjacent drivers in inverted or not inverted mode. As the time shifting is achieved by stimulating adjacent drivers, it is possible to adjust the delay or run time of a signal "on-fly" during operation of a circuit. By using matched drivers in the same chip and due to quite stable board parameters, the delay variations will be quite small across temperature or process variations. Therefore, a very accurate adjustment of the delay time of a signal is possible. Further, the delay time can be adjusted in very tiny steps. This ensures a secure transmission of a signal information and allows even higher transmission frequencies.

The preferred embodiment approach allows a synchronization of signals with a digital implementable algorithm. There is no need for an analog analyzing circuit. A synchronization of signals, for example data signals, can be necessary if the signal propagation of different signals differs because of a technical mismatch. Some of the signals may need a further delay other signals may need to be faster. The preferred embodiment approach allows to shift the delay of a signal even after the design is finished. Further, the preferred embodiment approach allows to synchronize signals to a strobe signal.

A further advantage is that the preferred embodiment is not limited to a particular circuit design but it works as well for in-chip applications as well as for the connections of integrated circuits on a circuit board.

Embodiments can be used in conjunction with the so-called "shielding trace" technique, wherein data and/or strobe traces on a printed circuit board or on an integrated circuit are interleaved by grounded or terminated traces to reduce a mutual coupling. If a trace is already shielded by such neighboring traces, these traces can be used to transmit an inverted or not inverted signal, according to the inventive embodiments.

According to an embodiment a signal line is neighbored by two further signal lines. During a switching event, a capacitive and inductive interaction in between the traces takes place. If signals on the three lines switch simultaneously, the delay of the middle signal is affected by the switching event on the neighboring lines.

According to a further embodiment the interaction of the neighboring signal lines is further improved by inserting a coupling element, for example a capacitance or an inductance between the neighboring lines.

In principle there are five possible combinations for switching. In even mode, the three signals are driven simultaneously with the same phase. In odd mode, the middle signal trace is driven in counter phase with the neighboring two traces. In a "neighbors off" mode, the neighboring signal traces are driven by a static "0" or "1".

In even mode, the delay of the signal on the middle trace is decreased. In odd mode, the delay of the signal on the middle trace is increased. In neighbors off mode, the delay of the signal on the middle trace is unchanged.

In "half even" or "half odd" mode, one of the neighboring signals is driven in phase with the middle signal and the other neighboring trace is driven by a static "0" or "1". In half even and half odd mode, the effect of a time shift on the middle signal is less strong than the effect in even mode or in odd mode, as in half even and half odd mode, only one of the neighboring signal is switching simultaneously with the middle signal.

Each of the five cases provides an individual amount of delay to the signal in the middle because of capacitive and/or inductive interaction, coupling or cross-talk in between the traces.

While the choice of half even and half odd mode already provides a fine adjustment of the delay of the middle signal, a further fine adjustment is possible by changing the driver resistances of neighboring drivers. An adjustment of the driver resistances makes it possible to have even smaller delay-changing steps.

As such a fine adjustment of the delay of the middle signal is possible, the inventive approach can be advantageously used for the adjustment of the delay in clock PLL feedback loops (PLL; PLL=phase locked loop), DLLs (DLL; DLL=delay locked loop) or OCDs (OCD; OCD=off chip driver). The inventive approach can be used for DLLs which synchronize data signals with a strobe signal or PLL feedback loops on registered DDR DIMM memory modules, where normally a lot of layout and discrete capacitor options are used for the adjustment of the delay.

BRIEF DESCRIPTION OF THE DRAWINGS

These and other features of the present invention will become clear from the following description taken in conjunction with the accompanying drawings, in which.

The following list of reference symbols can be used in junction with the figures
102 first driver
104 second driver
112 first receiver
114 second receiver
122 first signal line
124 second signal line
132 delay information
142 control unit
155 coupling element
202 first driver
204 second driver
206 third driver
212 first receiver
214 second receiver
216 third receiver
222 first signal line
224 second signal line
226 third signal line
302 first driver
304 second driver
306 third driver
312 first receiver
314 second receiver
322 first signal line
324 second signal line
326 third signal line
352, 354, 356 driver resistance
362, 364, 366 termination resistance
670 dielectric
671 ground plane
702 first driver
704 second driver
712 phase detector
714 ground
722 first signal line
724 second signal line
742a oscillator
742b means for adjusting
782 frequency output

DESCRIPTION OF THE PREFERRED EMBODIMENTS

In the following description of the preferred embodiments of the present invention, same or similar reference numbers are used for similar elements shown in different figures, wherein a repeated description of these elements is omitted.

Figure 1A:
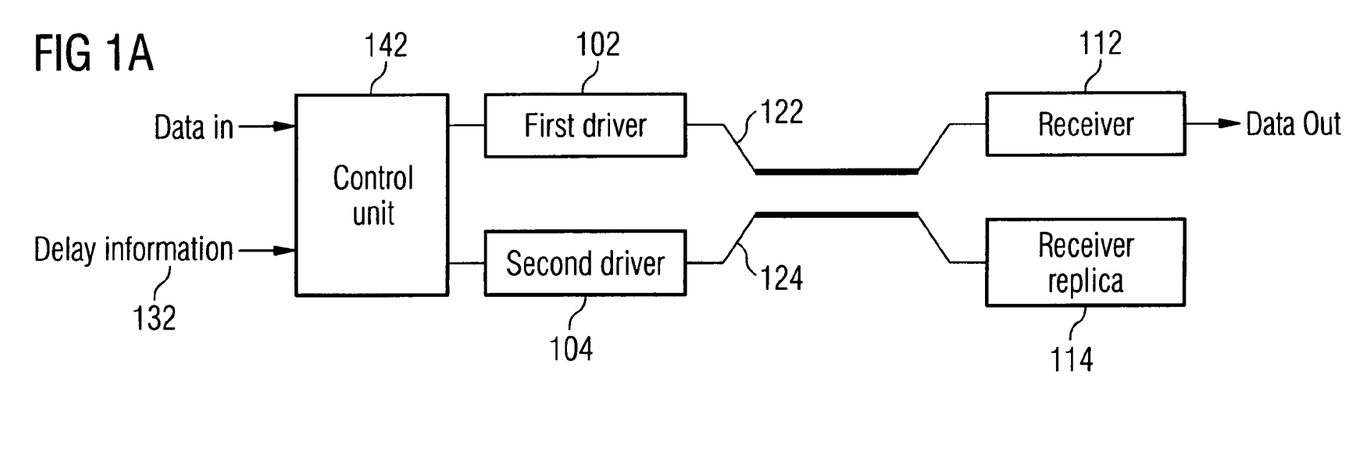
FIG. 1a is a schematic view of a circuit for transmitting a signal according to a first embodiment of the present invention.

FIG. 1a shows a schematic view of a circuit for transmitting a signal according to an embodiment of the present invention. The circuit comprises a first driver 102, a second driver 104, a first receiver 112 and a second receiver 114. The second receiver 114 can be realized as a receiver replica.

The first driver 102 is configured to drive a first signal onto the first signal line 122. The first signal line 122 transmits the first signal to the receiver 112. The second driver 104 is configured to drive a second signal onto the second signal line 124, which transmits the second signal to the receiver replica 114. The receiver replica 114 ensures that both the first and second signals have the same environment. The same environment is important in order to achieve the necessary interaction between the two signals. The receiver replica 114 has not to be a copy of a normal receiver, but has to imitate the input electrical properties, like R, L, C of a normal receiver. The receiver replica 114 has no data output, as the second signal is not a data signal but is used only for adjusting the delay of the first signal. Typically, the receiver 112 comprises a pair of transistors. The receiver replica 114 is used as a load to imitate the real receiver. In an ideal embodiment the second signal line 124 is connected to a further device pin. If no device pin is available for the receiver replica 114, a capacity or resistor can be used to imitate the property of the device. The first signal line is arranged adjacent to the second signal line, such that an interaction or cross-talk between signals being transmitted on the first signal line and the second signal line takes place. The signals 122, 124 can be routed adjacently for the whole distance between the drivers 102, 104 and the receivers 112, 114 or only for a part of the distance. In FIG. 1a the region in which the first and second lines 122, 124 are routed close together, such that an interaction takes place, is the middle part of the lines 122, 124.

The first driver is configured to switch the first signal onto the first signal line 122 from a high state to a low state or from a low state to a high state. The first signal arrives at the first receiver 112 with a delay time which depends for example on the length of the signal trace 122 or capacitances between the first signal trace 122 and neighboring signal traces 124 or a ground plane.

The delay of the first signal on the first signal line 122 can be affected by a switching of the electric potential of the second signal line 124 from a high to a low state or from a low to a high state. When the first driver 102 and the second driver 104 drive signals simultaneously on the signal lines 122, 124, the delay time of the first signal on the first signal line 122 depends on the switching of the second signal on the second signal line 124. If the second signal switches in phase with the first signal, the delay time of the first signal is decreased. In other words, the first signal arrives earlier at the first receiver 112 or the transmission of the first signal is accelerated. If the second signal switches in counter phase with the first signal, the delay time of the first signal is increased. In other words, the first signal is slowed down. In case of the second signal being static at a high or a low level, the delay time of the first signal is unchanged.

The signal lines 122, 124 are arranged such that an interaction of the signals can take place. The interaction depends on the distance between the two lines 122, 124 and on the length of the two lines 122, 124 being routed close together. The closer the two lines, the stronger is the effect of the cross-talk between the two signals. The same is true for the distance the two lines are routed close together. Thus, the effect of the capacitive or/and inductive coupling between the two lines can be adjusted by the distance of the two lines and the length in which the two lines are routed close together. In case of traces on a PCB, coupling will be mixed capacitive/inductive. In case of on-chip metal traces mostly capacitive coupling will play a role.

The second driver 104 is configured to drive the second signal on the second signal line 124 in phase or in opposite phase with the first signal on the first signal line 122, or at a static level. The decision of the driving mode of the second signal depends on the delay time of the first signal 122. Therefore, the second driver 104 is provided with delay information 132 on which the decision of the driving mode of the second signal is made. The delay of the first signal on the first signal line 122 can be measured on a prototype board, during a configuration mode or "on-fly" during operation of the circuit. Therefore, delay information 132 can be fixed in the circuit, pre-selectable, be stored within the circuit, for example in a memory unit which allows to change the delay information or be provided to the second driver 104 by a feedback circuit (not shown in FIG. 1a). A preprogrammed delay information is useful if there are only slight differences between chips. Typically this is true for chips taken from the same wafer. In this case a single chip can be tested and the measured delay information can be preprogrammed into chips of the same charge. Alternatively, adjusting the delay information during operation of the circuit is useful if there are changes in the delay during operation, for example because of voltage or temperature changes. In this case, the delay of the signals can be monitored and the delay information can be adjusted periodically, for example after each cycle or after 100 cycles. Such an operational feedback can be used for DLLs. In case of a DLL the delay information can be a time difference between a data and a strobe signal. Otherwise the delay can be the time between a data and a clock signal or between two other signals.

According to the embodiment shown in FIG. 1a, the first driver 102 and the second driver 104 are triggered by a control unit 142. The control unit 142 may be a memory controller which provides a memory signal to be output by the first driver 102. In FIG. 1a, the control unit 142 is configured to receive a "data in" signal which is to be transmitted by the first driver 102. Besides the first driver 102, the control unit 142 triggers the second driver 104, such that the second driver is adjusted to drive the second signal simultaneously with the first driver 102 driving the first signal. According to this embodiment, the control unit 142 receives the delay information 132 of the first signal. Depending on the delay information 132, the control unit 142 is configured to stimulate the second driver 104 to drive the second signal in phase, in opposite phase or at a static level.

The effect of the adjustment of the delay of the first signal on the first signal line 122 can be further increased by a third or further signals being arranged close to the first signal line 122. The further signals depend on the delay of the first signal and are controlled correspondingly to the second signal. The signal lines can be arranged on a common plane next to each other or on top of each other. Further, it is possible to arrange a plurality of signal lines next to each other on a first signal layer and a plurality of further signal lines on other signal layers which may be above or under the signal layer of the first signal line.

According to a further embodiment, the interaction between the first and second signal can be further adjusted by driving the second signal not exactly at the same time as the first signal by choosing different lengths for the first and second signal lines.

Figure 1B:
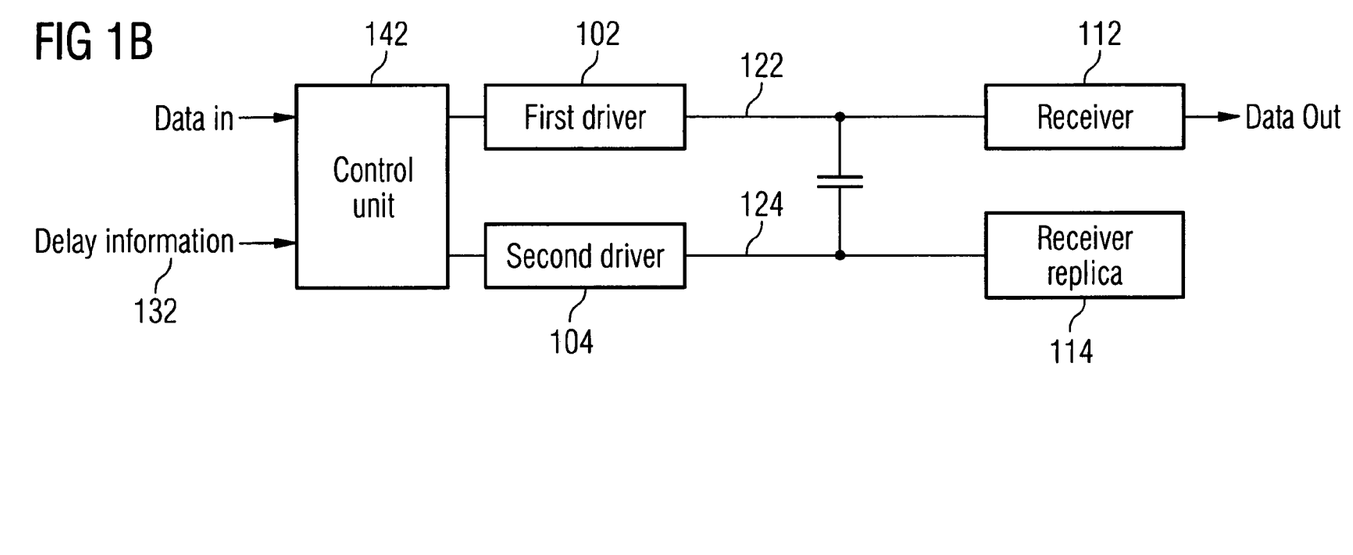
FIG. 1b is a schematic view of a circuit for transmitting a signal according to a second embodiment of the present invention.

FIG. 1b shows a schematic view of a circuit for transmitting a signal according to a further embodiment of the present invention. The first and second signal lines 122, 124 are coupled by a coupling element 155. In this embodiment the coupling element 155 is a capacitance which connects the first an second signal line 122, 124. Alternatively, an inductance can be used for coupling the signal lines 122, 124. The straight connection of the signal lines 122, 124 through the capacitance 155 establishes an interaction between the neighboring signal lines 122, 124. A coupling by way of a discrete coupling element 155 can be used to increase the coupling between adjacent lines 122, 124, for example if the length of the lines 122, 124 is not long enough to establish an interaction of a required strength.

Figure 2:
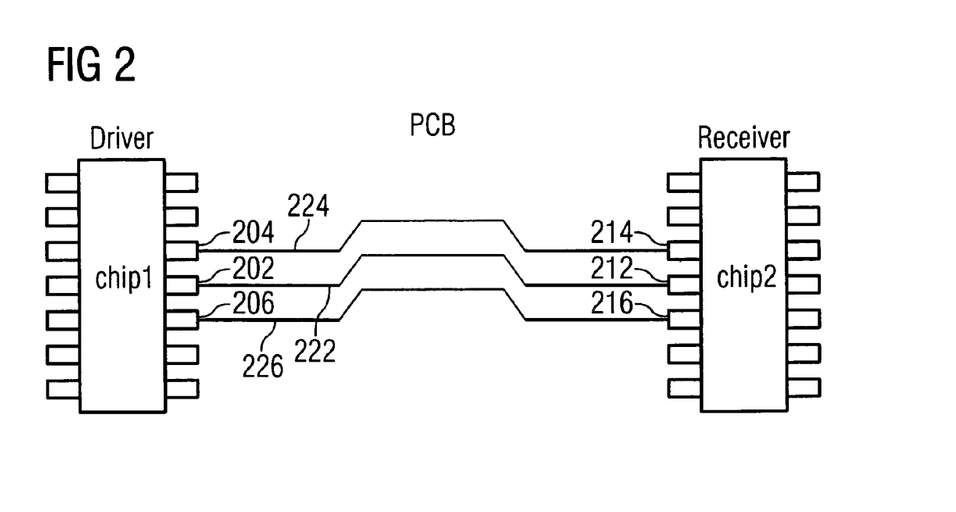
FIG. 2 is a schematic view of a circuit for transmitting a signal according to a third embodiment of the present invention.

FIG. 2 shows an example of a typical chip-to-chip communication, wherein a first chip functions as a driver and a second chip functions as a receiver. According to this embodiment, chip 1 and chip 2 are both integrated circuits, which are arranged on a printed circuit board. Chip 1 comprises a first driver 202, a second driver 204 and a third driver 206. Chip 2 comprises a first receiver 212, a second receiver 214 and a third receiver 216. Chip 1 and chip 2 are connected by a first signal line 222, a second signal line 224 and a third signal line 226. The first signal line 222 connects the first driver 202 with the first receiver 212, the neighboring signal lines 224, 226 connect the second and third drivers 204, 206 with the corresponding second and third receivers 214, 216.

According to this embodiment, the first driver 202 is configured to transmit a first information signal, like a memory data signal, on the first signal line 222 to the first receiver 212, the second and third drivers 204, 206 are not used to transmit an information signal but to transmit an adjustment signal. The adjustment signals on the neighboring signal lines 224, 226 are used to adjust the delay of the first information signal on the first signal line 222. According to this embodiment, the first signal line 222 is routed in between the second and third signal lines 224, 226 and the three signal lines are arranged on a common signal plane of a printed circuit board such that a cross-talk between the three lines 222, 224, 226 takes place.

Figure 3:
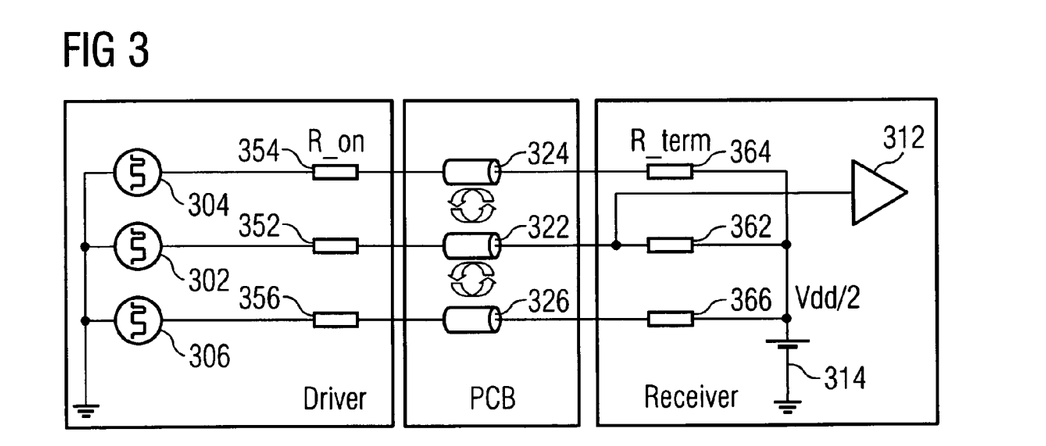
FIG. 3 is a simplified equivalent schematic of the circuit shown in FIG. 2.

FIG. 3 shows a simplified equivalent schematic of the embodiment shown in FIG. 2. According to this embodiment, the driver chip comprises three drivers 302, 304, 306, and the receiver chip comprises a first receiver 312 and a common second receiver 314. The drivers 302, 304, 306 and the receiver are connected by signal lines 322, 324, 326 on a printed circuit board. The drivers 302, 304, 306 comprise driver resistances 352, 354, 356. The first receiver 312 comprises a first termination resistance 362, and the neighboring signal traces 324, 326 are terminated by termination resistances 364, 366 which terminate the neighboring signal lines 324, 326 to a voltage level Vdd/2 which corresponds to half of the supply voltage of the circuit.

According to this embodiment, the second and third signal lines 324, 326 are terminated to the same voltage level. As the signals on the second and third signal lines 324, 326 are not used for transmitting any information but are used for the adjustment of the first signal on the first signal line 322, the receiver 314 can be realized as a termination of the second and third signal lines 324, 326.

As indicated by the arrows between the signal lines 322, 324, 326, there is an interaction between neighboring signal lines during the switching events.

According to this embodiment, the driver and receiver chips are part of a memory circuit. For example the driver chip may be a memory controller and the receiver chip a memory chip on a memory module. The central trace 322 can be used, for example, for delivering a strobe to the receiver chip. The traces 324, 326 in FIG. 3 in top and bottom of the central trace 322 can be used for shielding and for the adjustment of the delay of the strobe signal of the central trace 322.

According to a further embodiment, the first signal line 322 is a bi-directional transmission line. Therefore, the second and third transmission lines 324, 326 have to be bi-directional too.

Figure 4:
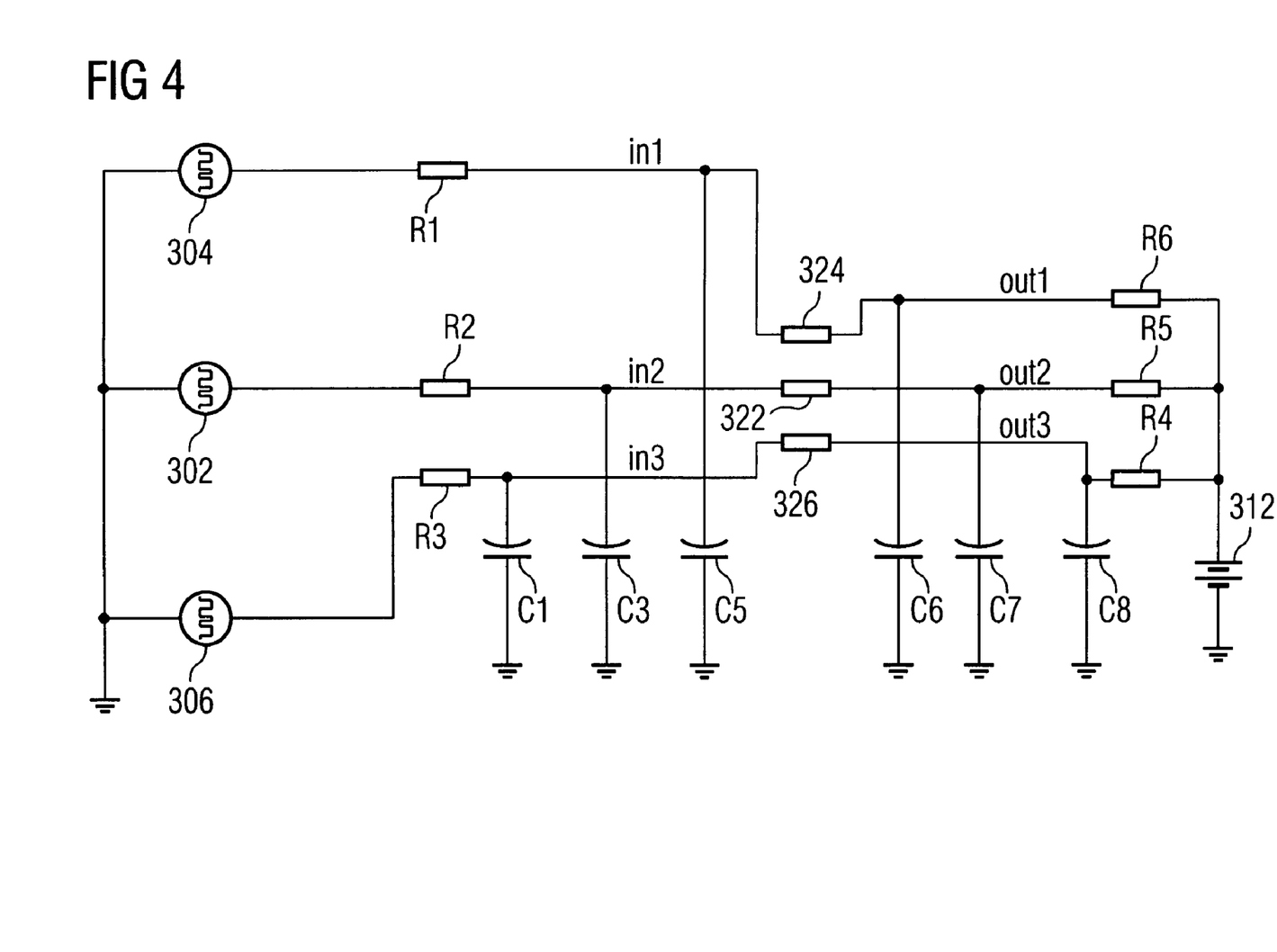
FIG. 4 is a graphical view of the interaction according to an embodiment of the present invention.

FIG. 4 shows a simulation schematic of the embodiment shown in FIG. 3. The simulation is based on an Agilent ADS simulator. The signal lines 322, 324, 326 are simulated as PCB traces with a characteristic impedance of 60 Ohm. Such an impedance is typical for DDR memory modules PCB (PCB; PCB=Printed Circuit Board).

Figure 6:
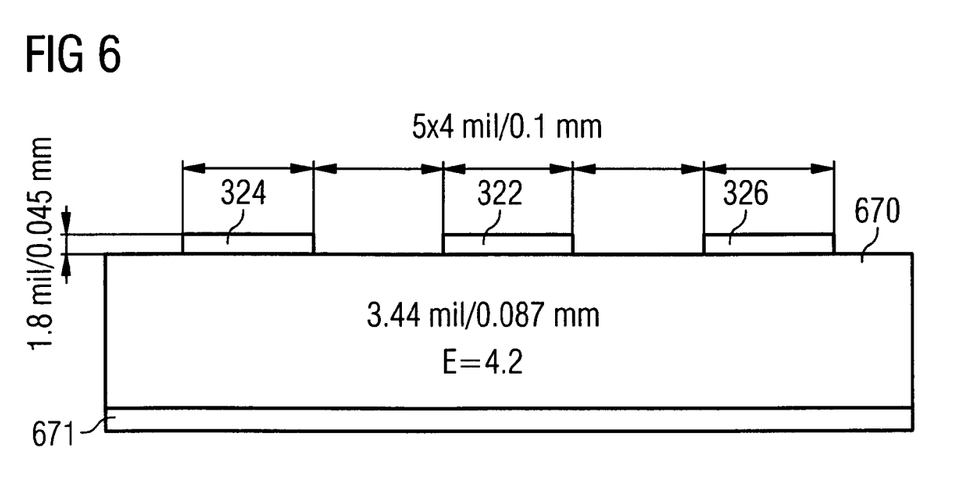
FIG. 6 is a schematic view of a board stackup used for the simulation of the embodiment shown in FIG. 4.

The trace lengths of the signal lines 322, 324, 326 is 500 mil (12.7 mm), the width is 4 mil (0.1 mm) and an edge to edge spacing is 4 mil. A cross-sectional view through a printed circuit board as it is used for the simulation is shown in FIG. 6. The bit rate used for simulation is 1.6 Gbps (Giga bit per second). The voltage swing between the low voltage and the high signal voltage is 0 V to 1.8 V.

The rise/fall time is 150 ps and the driver resistance of the resistors R1, R2, R3 is 40 Ohm. The receiver termination R4, R5, R6 is 60 Ohm. The driver/receiver capacitance C1, C3, C5, C6, C7, C8 is 2.5 pF. For simulation a simple 36 bit long pseudo-random bit sequence "010100110001110000111101111000010000" is used.

Figure 5:
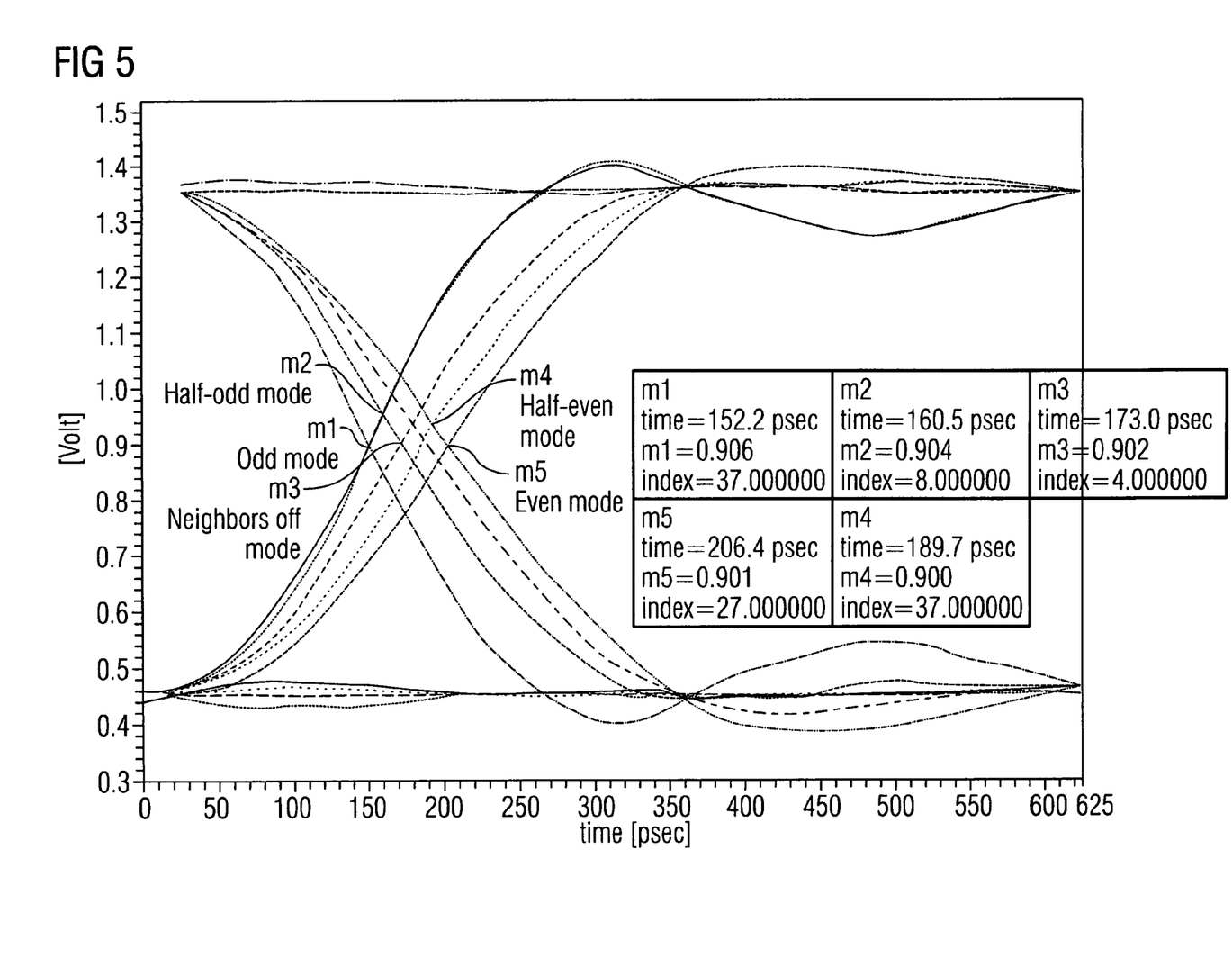
FIG. 5 is a simulation schematic for the results shown in FIG. 4.

FIG. 5 shows the resulting data eye of the simulation based on the simulation schematic shown in FIG. 4. The data eyes presented in FIG. 4 are from signals in all modes, i.e., the second and third signal lines 324, 326 are driven in phase, in anti-phase or at a static level compared to the first signal on the first signal line 322.

In the neighbor off mode, the second and third signals are on a static level. Therefore, the first signal on the first signal line 322 is not affected by the neighboring signal lines. As shown in FIG. 5, the crossing point of the first signal is at 0.9 V, at 173.0 psec.

By stimulating the circuit in odd mode or in half odd mode, the crossing-point can be shifted to the left side, which means that the delay of the first signal is reduced. By stimulating the circuit with the half even mode or the even mode, the crossing point can be shifted to the right side, which means that the delay of the first signal is increased.

In odd mode, the second and third signals are driven in counter phase to the first signal. The crossing point of the first signal in odd mode is at 152.2 psec. By choosing the odd mode, the delay of the first signal can be reduced by 20.8 psec. In half odd mode, which means that one of the second or third signal is driven in counter phase to the first signal and the other one is driven at a static level, the crossing point of the first signal is at 160.5 psec, which means that the delay of the first signal is reduced by 12.5 psec.

In even mode, which means that the second and third signals are driven in phase with the first signal, the crossing point of the first signal is at 206.5 psec, which means that the delay of the first signal is increased by 33.4 psec. In half even mode, which means that one of the second or the third signals is driven in phase with the first signal and the other one is driven at a static level, the crossing point of the first signal is at 189.7 psec, which means that the delay of the first signal is increased by 16.7 psec.

This shows that a length of 12.7 mm of interacting traces allow a delay adjustment in the range of approximately +/−27 psec with a step of approximately 13.5 psec. The adjustment range could be widened by using longer traces or a smaller edge-to-edge trace spacing.

FIG. 6 shows a cross-sectional view through a printed circuit board as it is used for the simulation described in FIGS. 4 and 5. The printed circuit board comprises an Fr 4 dielectric 670. The dielectric 670 has a thickness of 3.44 mil (0.087 mm) and a dielectric constant of E=4.2. A bottom surface of the dielectric 670 is covered by a ground plane 671 which is made of copper. On the opposite surface of the ground plane 671, the three signal traces 322, 324, 326 are arranged. The signal traces are of copper. The signal traces have a height of 1.8 mil (0.045 mm) and a width of 4 mil (0.1 mm). There is a distance of 4 mil (0.1 mm) between the three traces 322, 324, 326.

Depending on the conditions, the inventive method for transmitting a signal may be implemented in hardware or in software. The implementation may be performed on a digital storage medium, in particular a disc or a CD using control signals which may be read out electronically, which may thus cooperate with the programmable computer system so that the method is performed. Generally, the invention is also present in a computer program product comprising a program code stored on a machine-readable carrier for performing the inventive method for encrypting original data when the computer program product runs on a computer. In other words, the invention may also be realized as a computer program having a program code for performing the method for encrypting original data when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following patent claims be interpreted as including all such alterations, permutations, and equivalents that fall within the true spirit and scope of the present invention.

What is claimed is:

1. A circuit for transmitting a signal, comprising:
a first signal line;
a second signal line, wherein the second signal line is arranged adjacent to the first signal line, such that an interaction between signals being transmitted on the signal lines takes place;
a first driver for driving a first signal on the first signal line, wherein the first signal comprises a delay;
a second driver for driving a second signal on the second line, wherein the second driver is configured to drive the second signal depending on the delay of the first signal, such that the delay of the first signal is adjusted due to the interaction of the second signal on the first signal; and
a memory unit for storing a delay information about the delay of the first signal, wherein the memory unit is configured to provide the delay information to the second driver.

2. The circuit according to claim 1, wherein the second driver is configured to drive the second signal in phase with the first signal, such that the delay of the first signal is reduced.

3. The circuit according to claim 1, wherein the second driver is configured to drive the second signal in counter phase with the first signal, such that the delay of the first signal is increased.

4. The circuit according to claim 1, wherein the second driver is configured to drive the second signal at a static level, such that the delay of the first signal is unchanged.

5. The circuit according to claim 1, wherein the second signal line is arranged physically adjacent to the first signal line such that cross-talk between signals being transmitted on the signal lines takes place.

6. The circuit according to claim 1, wherein only a portion of the first signal line is physically adjacent the second signal line, the portion comprising less than all of the first signal line.

7. The circuit according to claim 1, further comprising a third signal line, wherein the third signal line is arranged adjacent to the first signal line such that an interaction between signals being transmitted on the first and third signal lines takes place; and
a third driver driving a third signal on the third line, wherein the third driver is configured to drive the third signal depending on the delay of the first signal, such that the delay of the first signal is further adjusted due to the interaction of the third signal on the first signal.

8. The circuit according to claim 7, wherein the third driver is configured to drive the third signal in phase or in counter phase to the second signal, such that the delay of the first signal is further increased or decreased, or is configured to drive the third signal on a static level, such that the delay of the first signal is not further changed.

9. The circuit according to claim 1, further comprising a coupling element for increasing the interaction between the first and second signal lines, wherein the coupling element is connected to the first signal line and to the second signal line.

10. The circuit according to claim 9, wherein the coupling element comprises a capacitor.

11. A circuit for transmitting a signal, comprising:
a first signal line;
a second signal line, wherein the second signal line is arranged adjacent to the first signal line, such that an interaction between signals being transmitted on the signal lines takes place;
a first driver for driving a first signal on the first signal line, wherein the first signal comprises a delay; and
a second driver for driving a second signal on the second line, wherein the second driver is configured to drive the second signal depending on the delay of the first signal, such that the delay of the first signal is adjusted due to the interaction of the second signal on the first signal, wherein the second driver comprises a driver resistance and is configured to change the driver resistance depending on the delay of the first signal in order to fine adjust the interaction of the second signal onto the first signal.

12. The circuit according to claim 11, further comprising a capacitor connected to the first signal line and to the second signal line.

13. A circuit for transmitting a signal, comprising:
a first signal line;
a second signal line, wherein the second signal line is arranged adjacent to the first signal line, such that an interaction between signals being transmitted on the signal lines takes place;
a first driver for driving a first signal on the first signal line, wherein the first signal comprises a delay;
a second driver for driving a second signal on the second line, wherein the second driver is configured to drive the second signal depending on the delay of the first signal, such that the delay of the first signal is adjusted due to the interaction of the second signal on the first signal; and
a receiver for receiving the first signal, wherein the receiver is configured to determine the delay of the first signal and to provide a delay information to the second driver.

14. The circuit according to claim 13, wherein the circuit comprises a delay locked loop for adjusting the first signal to a strobe signal, and wherein the delay information is a delay difference between the first signal and the strobe signal.

15. The circuit according to claim 13, further comprising a memory unit for storing a delay information about the delay of the first signal, wherein the memory unit is configured to provide the delay information to the second driver.

16. The circuit according to claim 13, further comprising a coupling element for increasing the interaction between the first and second signal lines, wherein the coupling element is connected to the first signal line and to the second signal line.

17. The circuit according to claim 16, wherein the coupling element comprises a capacitor.

18. A circuit for transmitting a signal, comprising:
a first signal line;
a second signal line, wherein the second signal line is arranged adjacent to the first signal line, such that an interaction between signals being transmitted on the signal lines takes place;
a third signal line, wherein the third signal line is arranged adjacent to the first signal line such that an interaction between signals being transmitted on the first and third signal lines takes place, wherein the first line is arranged between the second and third lines and wherein the lines are arranged on a common plane;
a first driver for driving a first signal on the first signal line, wherein the first signal comprises a delay;
a second driver for driving a second signal on the second line, wherein the second driver is configured to drive the second signal depending on the delay of the first signal, such that the delay of the first signal is adjusted due to the interaction of the second signal on the first signal; and
a third driver driving a third signal on the third line, wherein the third driver is configured to drive the third signal depending on the delay of the first signal, such that the delay of the first signal is further adjusted due to the interaction of the third signal on the first signal.

19. A circuit for transmitting a signal, comprising:
a first signal line;
a second signal line, wherein the second signal line is arranged adjacent to the first signal line, such that an interaction between signals being transmitted on the signal lines takes place;
a first driver for driving a first signal on the first signal line, wherein the first signal comprises a delay;
a second driver for driving a second signal on the second line, wherein the second driver is configured to drive the second signal depending on the delay of the first signal, such that the delay of the first signal is adjusted due to the interaction of the second signal on the first signal;
a first receiver coupled to the first signal line such that the first driver drives the first signal to the first receiver; and
a second receiver coupled to the second signal line such that the second driver drives the second signal to the second receiver, wherein the second receiver is a replica of the first receiver.

20. A circuit for transmitting a signal, comprising:
a first signal line;
a second signal line, wherein the second signal line is arranged adjacent to the first signal line, such that an interaction between signals being transmitted on the signal lines takes place;
a first driver for driving a first signal on the first signal line, wherein the first signal comprises a delay; and
a second driver for driving a second signal on the second line, wherein the second driver is configured to drive the second signal depending on the delay of the first signal, such that the delay of the first signal is adjusted due to the interaction of the second signal on the first signal;
a first receiver coupled to the first signal line such that the first driver drives the first signal to the first receiver; and
a second receiver coupled to the second signal line such that the second driver drives the second signal to the second receiver, wherein the second receiver is physically adjacent the first receiver.

* * * * *